United States Patent [19]

Maruyama et al.

[11] Patent Number: 5,307,017
[45] Date of Patent: Apr. 26, 1994

[54] SPARKING VOLTAGE DETECTING DEVICE FOR INTERNAL COMBUSTION ENGINES

[75] Inventors: Shigeru Maruyama; Yuichi Shimasaki; Masaki Kanehiro; Takuji Ishioka; Shigeki Baba; Takashi Hisaki, all of Wako, Japan

[73] Assignee: Honda Giken Kogyo Kabushiki Kaisha, Tokyo, Japan

[21] Appl. No.: 980,034

[22] Filed: Nov. 23, 1992

[30] Foreign Application Priority Data

Nov. 28, 1991 [JP] Japan .................................. 3-339725

[51] Int. Cl.$^5$ .................................................. G01R 13/42
[52] U.S. Cl. .................................... 324/402; 73/118.1
[58] Field of Search ............... 73/118.1, 116; 324/402, 324/395, 658, 126; 439/169

[56] References Cited

U.S. PATENT DOCUMENTS 4,041,373 8/1977 Maringer .......................... 324/126 X
4,349,782 9/1982 Doss .................................. 324/395 X

FOREIGN PATENT DOCUMENTS

52-118135 10/1977 Japan .

Primary Examiner—Jerry W. Myracle
Attorney, Agent, or Firm—Nikaido, Marmelstein, Murray & Oram

[57] ABSTRACT

A sparking voltage detecting device for an internal combustion engine having an ignition system having at least one secondary side high-tension cord, is mounted on the secondary side high-tension cord, for detecting sparking voltage generated in the engine. A main body formed of an insulating material has at least one through hole formed therein. The high-tension cord is fitted through the through hole in a liquidtight manner. At least one conductive member is embedded in the main body at a location radially outward of the through hole and spaced from the high-tension cord by a predetermined distance. The main body has at least one incision formed therein, which extends from the outer surface of the main body to the through hole. The incision is forcibly expansible to an extent enough to allow the high-tension cord to be fitted into the conductive member is arranged at a side of the main body remote from the incision with respect to the through hole.

18 Claims, 7 Drawing Sheets

SPARKING VOLTAGE DETECTING DEVICE FOR INTERNAL COMBUSTION ENGINES

BACKGROUND OF THE INVENTION

1. Field of the Invention

This invention relates to a sparking voltage detecting device for spark-ignition type internal combustion engines, which detects sparking voltage generated in the engine.

2. Prior Art

Conventionally, sparking voltage detecting devices are known, which detect sparking voltage occurring on the secondary side of an ignition system of an internal combustion engine. One of such devices is disclosed in Japanese Provisional Patent Publication (Kokai) No. 52-118135, which comprises a sensor formed of a strip of a conductive material wound on a high-tension cord connected to a spark plug. The sensor forms a capacitor having very small capacitance with a coating insulating material of the high-tension cord acting as a dielectric, the conductive material strip being serially connected to a measuring capacitor which is grounded at one end thereof. A signal voltage is generated across the measuring capacitor according to the principle of electrostatic potential division, which voltage is detected as the sparking voltage.

However, although the known sparking voltage detecting device is capable of ascertaining whether or not sparking voltage is occurring, it is unable to accurately detect waveforms of sparking voltage, because the device has a simple structure formed of a conductive material strip wound on the high-tension cord, and hence is liable to have changes in the electrostatic capacity due to vibrations, changes in the temperature (humidity), etc. As a result, the measured voltage largely varies, badly affecting the detecting accuracy and the effective life of the device. Moreover, the sensor is located close to a voltage source (high-tension cord) generating several tens thousands volts, which requires the use of an expensive protective circuit for effecting a failsafe action in the event of a high voltage leak, and hence is complicated in structure.

SUMMARY OF THE INVENTION

It is an object of the invention to provide a sparking voltage detecting device for an internal combustion engine, which has improved detecting accuracy and a prolonged life, and which can dispense with the use of a protective circuit for coping with high voltage leak or the like, while facilitating mounting of high-tension cords onto a sensor thereof, and is therefore low in cost.

It is a further object of the invention to provide a sparking voltage detecting device for an internal combustion engine, which provides an stable output indicative of the detected sparking voltage.

It is another object of the invention to provide a sparking voltage detecting device for an internal combustion engine, which is less affected by external disturbances such as radio interference and external noise.

It is still another object of the invention to provide a sparking voltage detecting device for an internal combustion engine, which is light in weight and compact in size.

According to the invention, there is provided a sparking voltage detecting device for an internal combustion engine having an ignition system having at least one secondary side high-tension cord, the sparking voltage detecting device being mounted on the secondary side high-tension cord, for detecting sparking voltage generated in the engine, comprising:

a main body formed of an insulating material and having at least one through hole formed therein, the high-tension cord being fitted through the through hole in a liquidtight manner; and at least one conductive member embedded in the main body at a location radially outward of the through hole and spaced from the high-tension cord by a predetermined distance;

the main body having an outer surface, and at least one incision formed therein, the incision extending from the outer surface of the main body to the through hole, the incision being forcibly expansible to an extent enough to allow the high-tension cord to be fitted into the through hole through the incision, the conductive member being arranged at a side of the main body remote from the incision with respect to the through hole.

In an internal combustion engine having a plurality of cylinders, and an ignition system having a plurality of secondary side high-tension cords corresponding in number to the number of the cylinders, the main body has a plurality of through holes formed therein, which correspond in number to the number of the cylinders, the high-tension cords being fitted, respectively, through the through holes in a liquidtight manner. The at least one conductive member is embedded in the main body at a location radially outward of the through holes and spaced from the high-tension cords by a predetermined distance. The main body has a plurality of incisions formed therein, which correspond in number to the number of the cylinders, the incisions extending from the outer surface of the main body to the through holes, respectively.

In a preferred form of the invention, there is provided a sparking voltage detecting device for an internal combustion engine having a plurality of cylinders, and an ignition system having a plurality of secondary side high-tension cords corresponding in number to the number of the cylinders, the sparking voltage detecting device including a sensor mounted on the secondary side high-tension cords, for detecting sparking voltage generated in the engine, the sensor comprising:

a main body formed of an insulating material and having a plurality of through holes formed therein, the through holes corresponding in number to the number of the cylinders, the high-tension cords being fitted, respectively, through the through holes in a liquidtight manner; and at least one conductive member embedded in the main body at a location radially outward of the through holes and spaced from the high-tension cords by a predetermined distance;

the main body having an outer surface, and a plurality of incisions formed therein, the incisions corresponding in number to the number of the cylinders, the incisions extending from the outer surface of the main body to the through holes, respectively, the incisions being forcibly expansible to an extent enough to allow the high-tension cords to be fitted into the through hole through the incisions, respectively, the conductive member being arranged at a side of the main body remote from the incisions with respect to the through holes.

Advantageously, the sensor further includes at least one shielding member embedded in the main body at a location outward of the conductive member radially of the through holes.

Also advantageously, the sensor further includes at least one insulating member formed of ceramics, the insulating member being embedded in the main body at a location between the through holes and the conductive member.

The above and other objects, features, and advantages of the invention will become more apparent from the following detailed description taken in conjunction with the accompanying drawings.

DETAILED DESCRIPTION

The invention will now be described in detail with reference to the drawings showing embodiments thereof.

Figure 1:
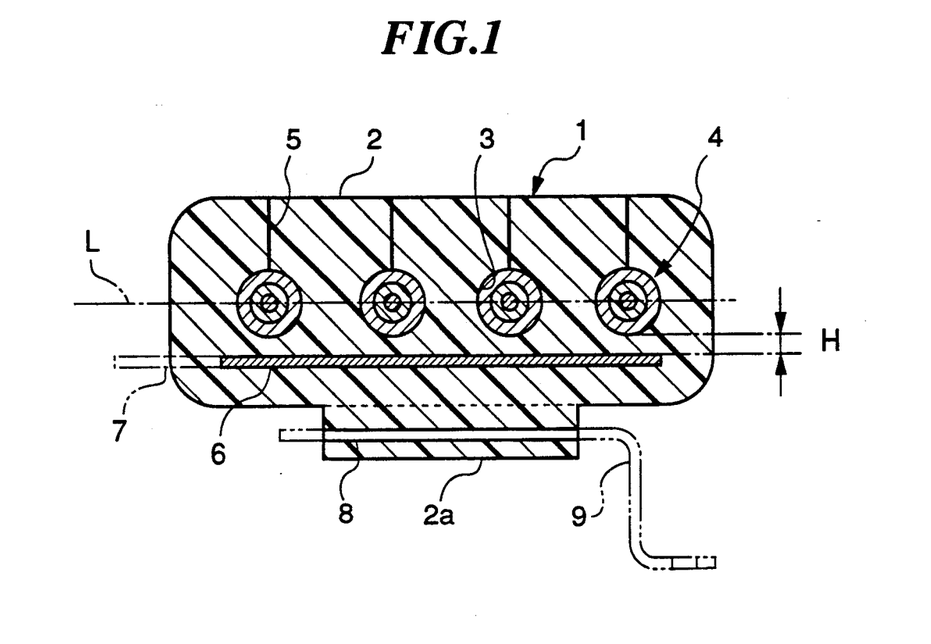
FIG. 1 is a longitudinal sectional view of a sensor of a sparking voltage detecting device for an internal combustion engine, according to a first embodiment of the invention.
Figure 2:
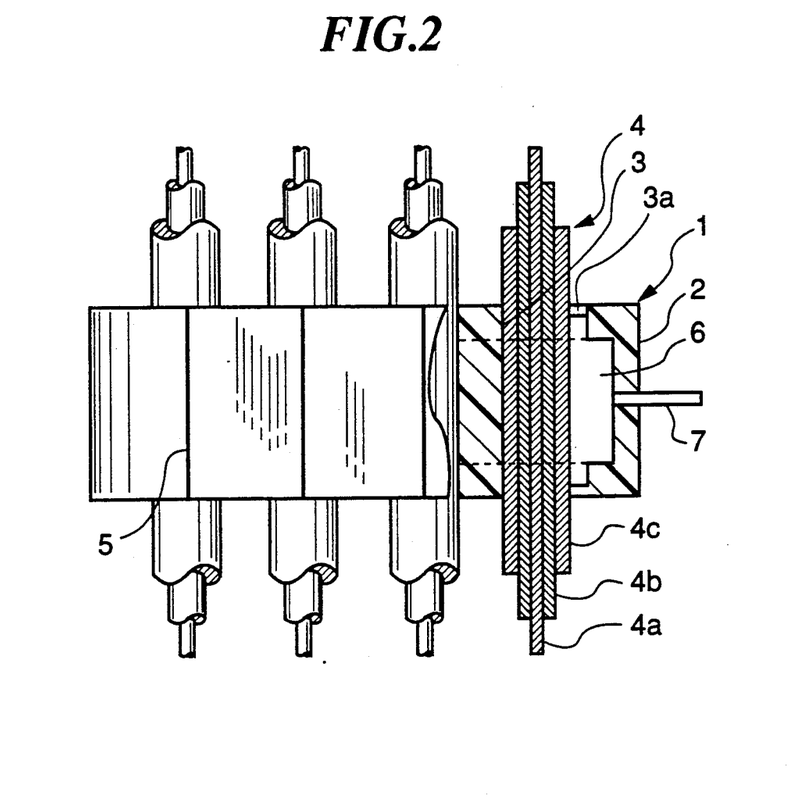
FIG. 2 is a top plan view, partly in section, of the sensor.

Referring first to FIGS. 1 and 2, there is illustrated a sensor 1, which forms an essential part of a sparking voltage detecting device for an internal combustion engine, according to a first embodiment of the invention. The sensor 1 has a main body 2 in the form of a block, which is formed of an insulating material such as rubber (EPDM) having high withstand voltage and silicon. The main body 2 has an oblong or generally rectangular cross section and is formed therein with a plurality of, e.g. four, through holes 3 corresponding in number to the number of cylinders of an engine, not shown. These through holes 3 are disposed such that their centers are located along a common line L intersecting with their axes at right angles, i.e. a line extending along the axis of the block 2. The holes 3 are arranged at equal intervals in a direction perpendicular to their axes.

Secondary side high-tension cords 4 of an ignition system of the engine are fitted through the through holes 3 in a liquidtight manner, respectively. These high-tension cords 4 each have a core wire 4a, and inner and outer coating layers 4b and 4c coated over the core wire 4a. The core wire 4a is comprised of a central wire formed of an aramid fiber or the like, and an outer wire formed of a Nichrome wire or the like wound around the central wire via an insulating material. The inner coating layer 4b is formed of an insulating material such as soft crosslinked polyethylene and high withstand voltage rubber (EPDM). The outer coating layer 4c is formed of an insulating material such as high withstand voltage rubber (EPDM). The diameter of each through hole 3 is larger than the outer diameter of the high-tension cords 4. Each through hole 3 has a pair of annular lips 3a formed integrally on inner peripheral surfaces of opposite ends thereof. The annular lips 3a have their inner peripheral surfaces disposed in liquidtight contact with the outer peripheral surface of the high-tension cord 4 to prevent water from infiltrating into the gap between the through hole 3 and the high-tension cord 4.

Straight incisions 5 in the form of slits (hereinafter referred to as "slits") are formed in the main body 2 and extend from an upper side surface of the main body 2 to inner peripheral surfaces of the respective through holes 3. The slits 5 can be forcibly expanded, e.g. by bending the main body 2. Thus, the high-tension cords 4 can be fitted into the through holes 3 by forcibly expanding the slits 5.

A conductive member 6, which is formed of a conductive material such as copper and an alloy thereof, is embedded in the main body 2 at a side of said main body remote from the slits 5 with respect to the through holes 3 in symmetry therewith. The conductive member 6 is in the form of a flat plate having a length at least equal to the length of the row of the through holes 3. The conductive member 6 is located at a lateral side of the main body 2, i.e. at a location radially outward of the through holes 3 at a predetermined distance H from the outer peripheral surfaces of the high-tension cords 4 fitted through the through holes 3. The predetermined distance H is set at such a value that the conductive member 6 is not substantially influenced by corona discharge from the high-tension cords 4, e.g., approximately 5–10 mm.

Connected to one end of the conductive member 6 is one end of a lead wire 7 formed of a shielding wire, which is comprised of a core formed of a conductive material, a shielding member formed of a conductive material and wound on the core via an insulting material, and an outer coating layer formed of an insulating material and wound on the shielding member. The lead wire 7 extends outwardly from one axial end of the main body 2 for transmitting a voltage signal from the conductive member 6 to a sparking voltage detecting unit, hereinafter referred to.

The main body 2 has a projection 2a extending integrally from a lower side surface thereof and formed therein with a slit 8 in which a fitting bracket member 9 is rigidly fitted for mounting the sensor 1 on a suitable portion of the engine.

The lead wire 7 is previously connected to the conductive member 6, and then the conductive member 6 is placed into a mold for forming the block or main body 2, together with the lead wire 7, to be molded together with the main body 2.

Figure 3:
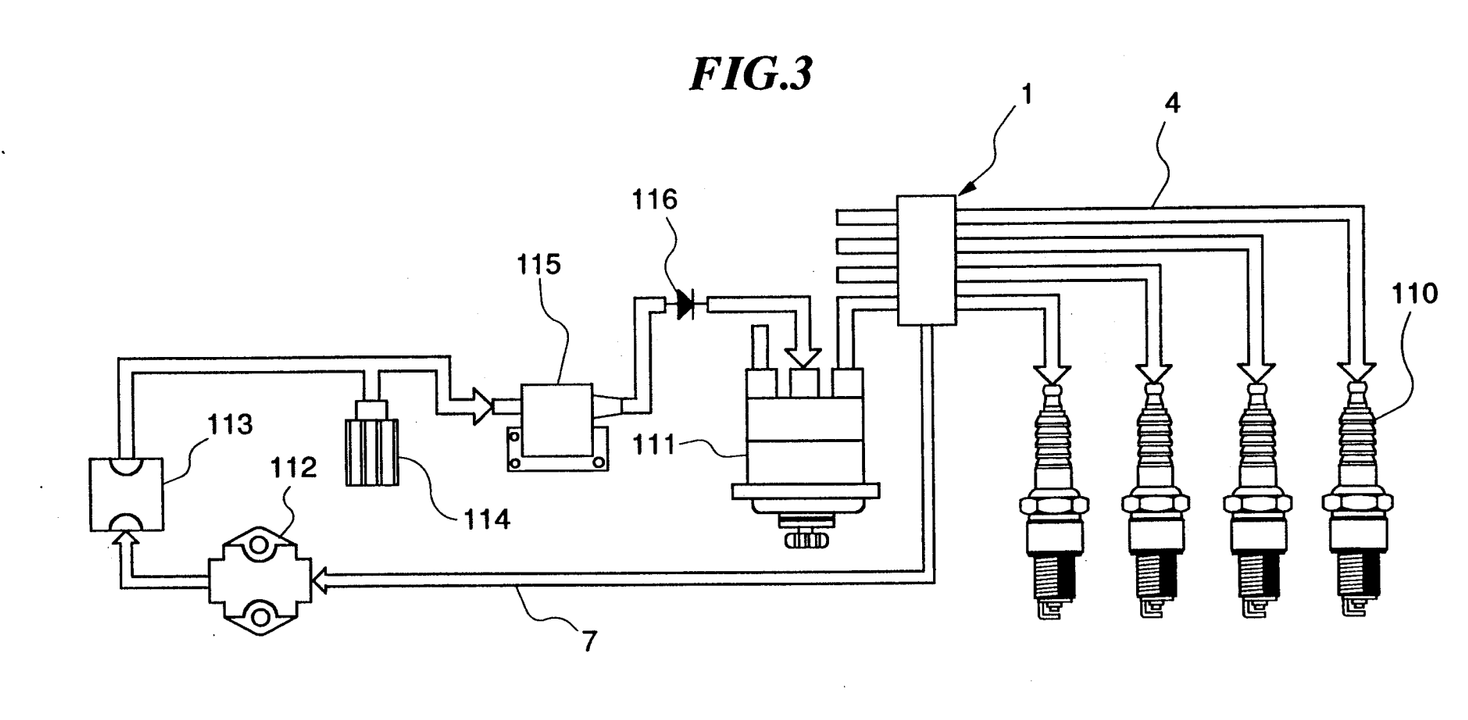
FIG. 3 is a schematic view of the whole arrangement of an ignition system of the engine, which is provided with the sparking voltage detecting device according to the invention.
Figure 4:
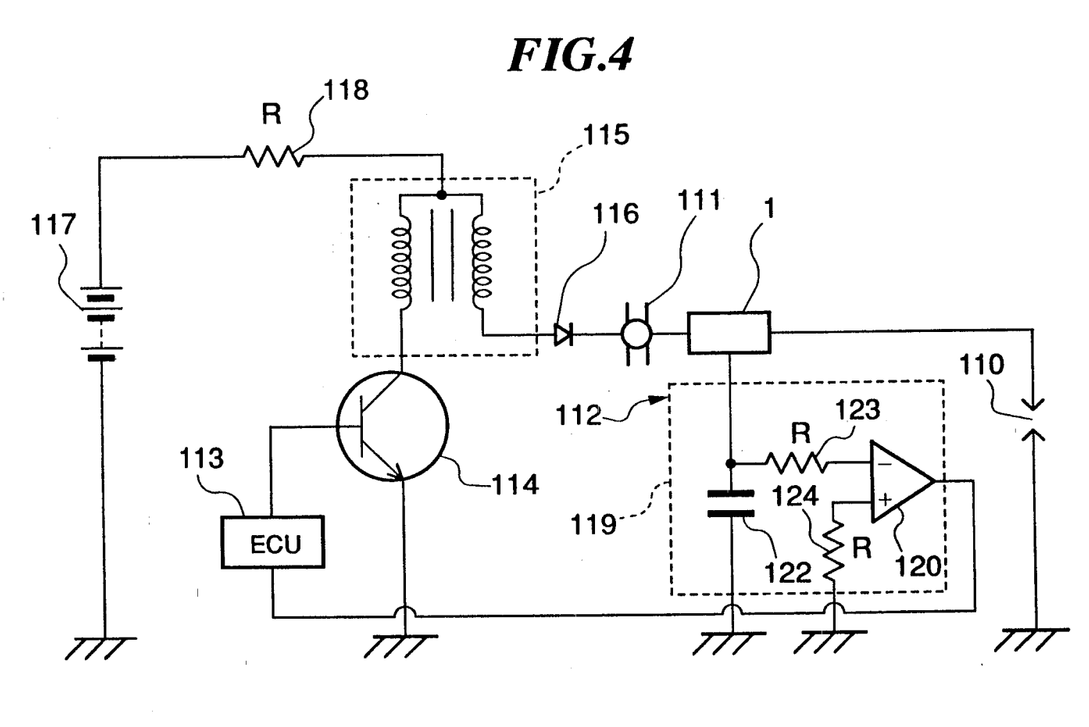
FIG. 4 is a circuit diagram of the electrical connection of the ignition system.

The sensor 1 of the sparking voltage detecting device constructed as above is incorporated in the ignition system of the engine, as shown in FIGS. 3 and 4. In the figures, the high-tension cords 4 fitted through the respective through holes 3 of the main body 2 of the sensor 1 are connected at one ends thereof to respective spark plugs 110 and at the other ends to an output of a distributor 111. The lead wire 7 extending from the main body 2 is connected to an input of the voltage detecting unit 112. The voltage detecting unit 112 and the sensor 1 cooperate to form the sparking voltage detecting device. An output of the voltage detecting unit 112 is connected to an input of an electronic control unit (ECU) 113. An output of the ECU 113 is connected to the input of the distributor 111 through an igniter 114, an ignition coil 115, and a diode 116. In FIG. 4, reference numeral 117 designates a power supply (battery), a positive terminal of which is connected to the ignition coil 115 through a resistance 118. The voltage detecting unit 112 has a determining circuit 119 which determines whether the sparking voltage is normal or not. The circuit 119 is formed by an operational amplifier 120, a capacitor 122, and resistances 123 and 124.

The operation of the sparking voltage detecting device constructed as above will now be described:

The ECU 113 supplies an ignition command signal to the igniter 114 at a timing determined by the rotational speed of the engine, etc. The igniter 114 cuts off primary current flowing in the ignition coil 115 in response to the ignition command signal to cause generation of high voltage on the secondary side of the ignition coil 115, which voltage is distributed by the distributor 111 to be applied to the spark plugs of the engine cylinders through the respective high-tension cords 4.

The above high voltage, i.e. sparking voltage is detected by the sensor 1, an output voltage signal of which is supplied to the voltage detecting unit 112 where the determining circuit 119 compares the sparking voltage with a predetermined voltage value to determine whether the sparking voltage is normal or not, and supplies a determination signal to the ECU 113 as information for setting the ignition timing.

The above described operation is substantially identical with that of a conventional ignition system.

In the present embodiment, as described hereinbefore, the conductive member 6 is embedded in the main body 2 formed of an insulating material at a location radially outward of the through holes 3 at a predetermined distance from the outer peripheral surfaces of the high-tension cords 4, and the high-tension cords 4 are supportedly fitted through the through holes 3. As a result, the conductive member 6 is firmly held in spaced relation to the high-tension cords 4 with an accurate predetermined clearance between the members 4, 6. Therefore, it is possible to prevent the conductive member 6 from being adversely influenced by corona discharge from the high-tension cords 4 so that the conductive member 6 has a prolonged life and can provide a stable and accurate detected voltage output.

Further, the slits 5 formed in the main body 2 can be forcibly expanded so that the high-tension cords 4 can be fitted into the through holes 3 through the expanded slits 5, thus facilitating mounting of the high-tension cords 4 into the sensor 1. In this connection, the slits 5 may be sealed after the high-tension cords 4 have been fitted into the through holes 3, thereby preventing the high-tension cords 4 from slipping out of the through holes 3.

Besides, since the high-tension cords 4 are fitted through the through holes 3 in a liquidtight manner, the electrostatic capacity of the conductive member 6 is not liable to be affected by vibrations, humidity (moisture), etc., thereby enabling to dispense with the use of a protective circuit for coping with a leak of high voltage.

Besides, since the lead wire 7 is formed by a shielding wire, the sparking voltage detecting device has improved stability against external disturbances such as radio interference and noise.

Next, second to eighth embodiments of the invention will be described with reference to FIGS. 5 to 11. In FIGS. 5 to 11, elements and parts corresponding to those in FIGS. 1 to 4, referred to above, are designated by identical reference numerals, description of which is omitted.

Figure 5:
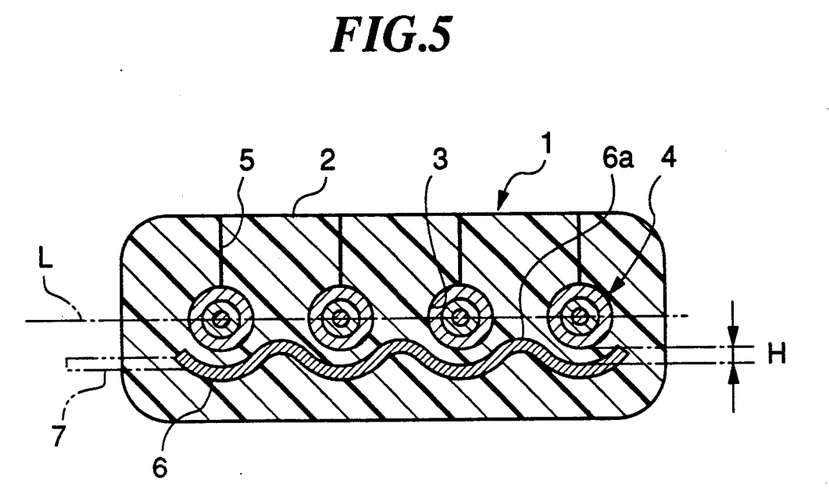
FIG. 5 is a longitudinal sectional view of a sensor of a sparking voltage detecting device according to a second embodiment of the invention.

FIG. 5 shows a second embodiment of the invention. According to the second embodiment, a single conductive member 6 in the form of a corrugated or waved plate is embedded in the main body 2 and arranged at one lateral side of the block or main body with respect to the line L extending through the centers of the through holes 3. The conductive member has a length at least equal to the length of the row of the through holes 3. One end of the lead wire 7 is connected to one end of the conductive member 6. The conductive member 6 has concave portions 6a facing the respective through holes 3 in concentricity thereto.

Figure 6:
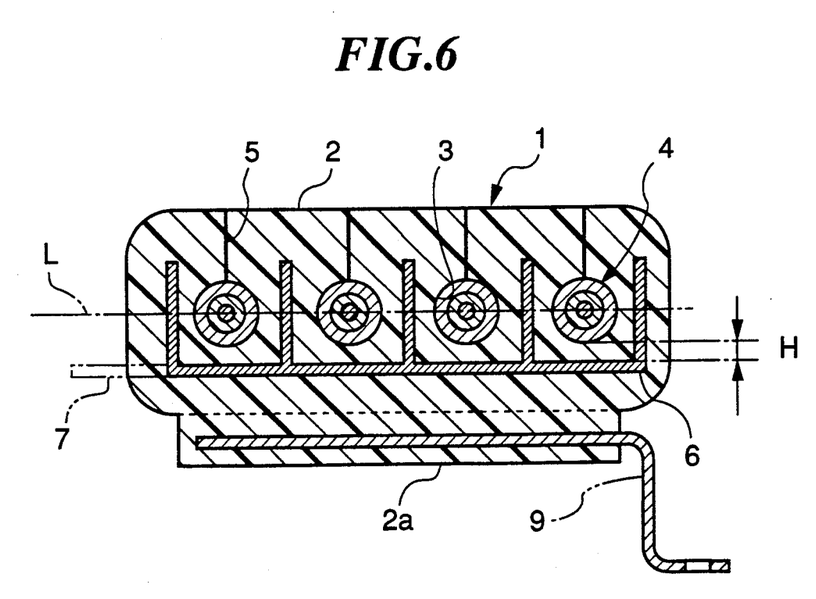
FIG. 6 is a longitudinal sectional view of a sensor of a sparking voltage detecting device according to a third embodiment of the invention.

FIG. 6 shows a third embodiment of the invention. A conductive member 6 according to the third embodiment has a plurality of, e.g. five, walls extending integrally from a flat platelike base portion and defining separate compartments having a generally U-shaped configuration. The through holes 3 are partly enclosed by the respective compartments. Further, like the first embodiment of FIG. 1, the main body 2 has an integral projection 2a in which a fitting bracket member 9 is fitted.

According to the above described first to third embodiments of the invention, the conductive member 6 is arranged at one side of the main body 2 radially outward of the through holes 3 with respect to the line L extending through the centers of the through holes 3. As a result, the whole sensor 1 can be designed compact in size. Further, as in the second and third embodiments, if the conductive member 6 has an increased surface area facing the high-tension cords 4 in spaced relation thereto by a predetermined distance, the sparking voltage can be detected with higher accuracy, since the electrostatic capacity is increased.

Figure 7:
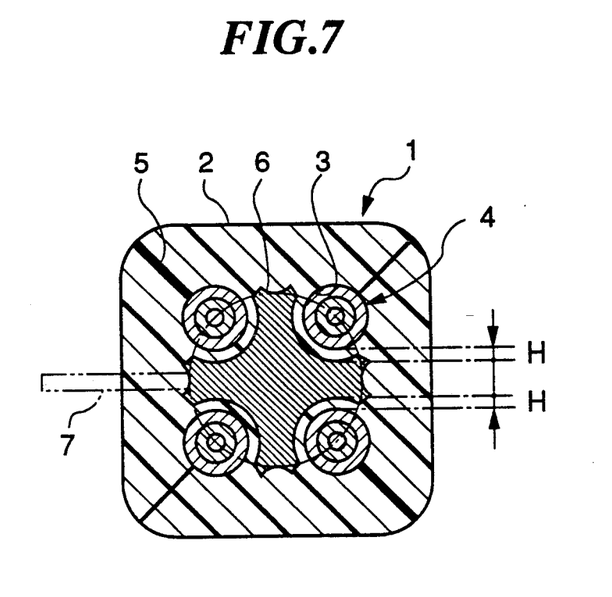
FIG. 7 is a longitudinal sectional view of a sensor of a sparking voltage detecting device according to a fourth embodiment of the invention.

FIG. 7 shows a fourth embodiment of the invention. According to the fourth embodiment, through holes 3 are formed in the main body 2 with their centers located along a circle L; formed about a central portion of the main body 2 having a generally square cross section, and the through holes 3 are arranged at circumferentially equal intervals. The conductive member 6 is formed by a generally cruciform element having four arms and arranged at a central portion of an area defined between the through holes 3. The conductive member 6 has four wall portions having arcuate surfaces facing the respective through holes 3 in concentricity thereto. One end of the lead wire 7 is connected to one arm of the conductive member 6. Straight slits 5 are formed in four corner portions of the main body 2 and extend from outer surfaces of the main body 2 to the respective through holes 3.

Figure 8:
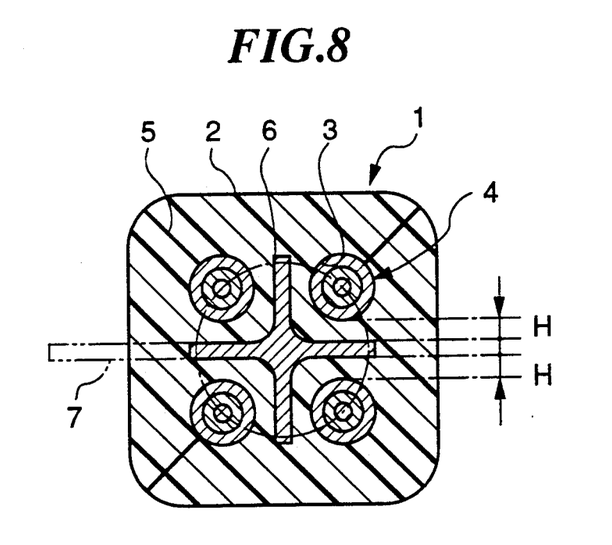
FIG. 8 is a longitudinal sectional view of a sensor of a sparking voltage detecting device according to a fifth embodiment of the invention.

FIG. 8 shows a fifth embodiment of the invention. A conductive member 6 according to the fifth embodiment is formed by a generally cruciform element having four arms but generally more slender than the conductive member 6 of the preceding embodiment, and arranged at a central portion of an area defined between the through holes 3 arranged similarly to the fourth embodiment of FIG. 7. The conductive member 6 has four wall portions having angled surfaces facing the respective through holes 3. One end of the lead wire 7 is connected to one arm of the conductive member 6. Similarly to the fourth embodiment of FIG. 7, four straight slits 5 are formed in four corner portions of the main body 2.

Figure 9:
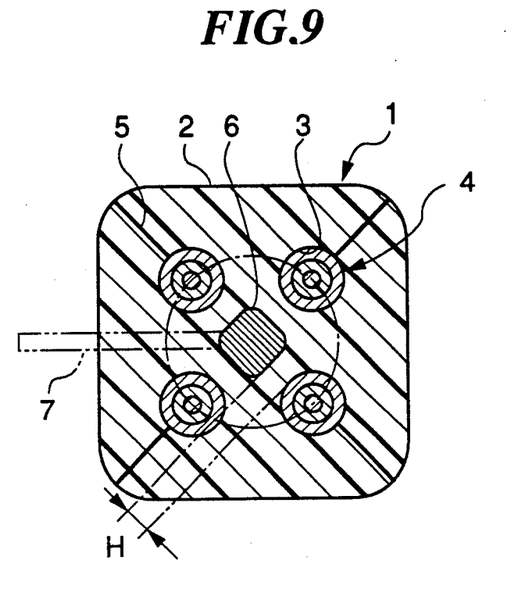
FIG. 9 is a longitudinal sectional view of a sensor of a sparking voltage detecting device according to a sixth embodiment of the invention.

FIG. 9 shows a sixth embodiment of the invention. A conductive member 6 according to the sixth embodiment is in the form of a rod having a generally square cross section and arranged at a central portion of an area defined between the through holes 3 arranged similarly to the fourth embodiment of FIG. 7. One end of the lead wire 7 is connected to one corner of the conductive member 6. Similarly to the fourth embodiment of FIG. 7, four straight slits 5 are formed in four corner portions of the main body 2.

According to the fourth to sixth embodiments of FIGS. 7 to 9, described above, the through holes 3 are arranged with their centers located along the circle $L_1$ formed about a central portion of the main body having a generally square cross section, the through holes 3 being arranged at circumferentially equal intervals. As a result, the whole sensor 1 can be designed more compact in size, as compared with the first to third embodiments.

Figure 10:
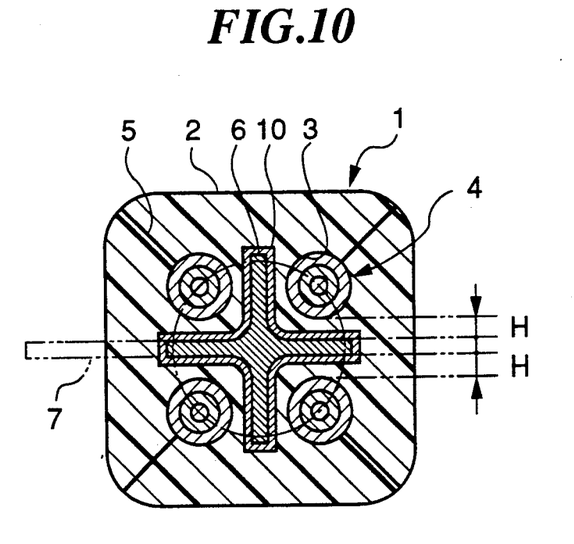
FIG. 10 is a longitudinal sectional view of a sensor of a sparking voltage detecting device according to a seventh embodiment of the invention.

FIG. 10 shows a seventh embodiment of the invention. The seventh embodiment is substantially identical in arrangement with the fifth embodiment of FIG. 8, except that a hollow insulating member 10 formed of ceramics and having a generally cruciform cross section is attached to the whole outer surfaces of the conductive member 6 having a generally cruciform cross section and arranged with its center located at a central portion of an area defined between the through holes 3.

According to the seventh embodiment described above, an insulating member formed of ceramics is provided between the through holes and the conductive member. As a result, in addition to the effects of the first to sixth embodiments described hereinbefore, it is possible to positively prevent the conductive member 6 from undergoing the influence of corona discharge from the high-tension cords and hence arrange the conductive member at a location closer to the high-tension cords, to thereby enable to make the whole sensor more compact in size and lighter in weight, while prolonging the effective life of the conductive member(s) due to reduced deterioration of the conductive member, as compared with the first to sixth embodiments previously described.

Although in the above described seventh embodiment the insulating member formed of ceramics is added to the arrangement of the fifth embodiment of FIG. 8, this is not limitative, but the insulating member may be also added to the first to fourth embodiments and the sixth embodiment previously described, in a manner embedded in the main body 2 at a location between the through holes 3 and the conductive member 6.

Figure 11:
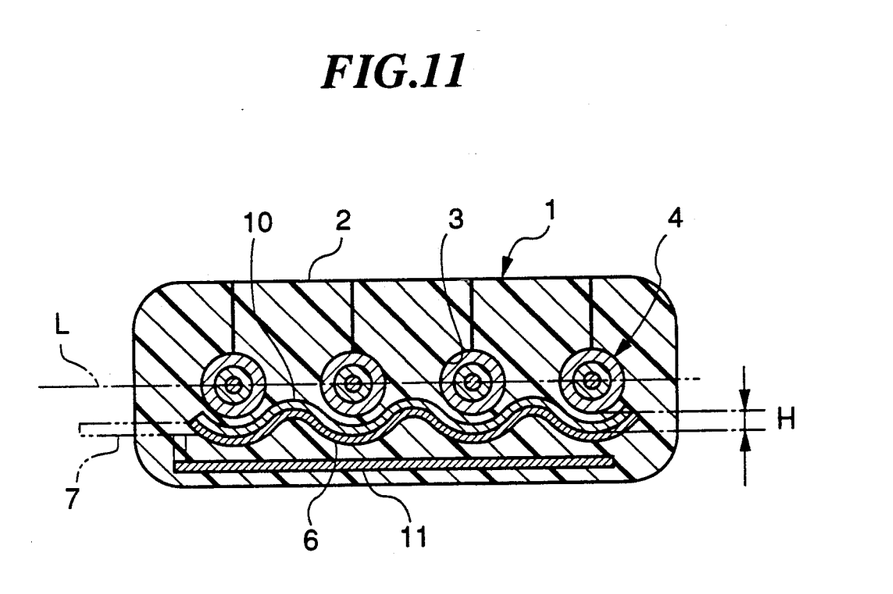
FIG. 11 is a longitudinal sectional view of a sensor of a sparking voltage detecting device according to an eighth embodiment of the invention.

FIG. 11 shows an eighth embodiment of the invention. The eighth embodiment is substantially identical in arrangement with the second embodiment of FIG. 5, described hereinbefore, except that an insulating member 12 formed of ceramics in the form of a corrugated or waved plate is attached to the whole inner side surface of a corrugated conductive member 5 facing the through holes 3, and a shielding member 11 in the form of a flat plate is embedded in the main body 2 at a side outward of the conductive member 6 radially of the through holes 3. One end of the lead wire 7 is connected to one end of the conductive member 6, as well as to one end of the shielding member 11.

According to the eighth embodiment described above, a shielding member is additionally arranged at a location outward of the conductive member radially of the through holes. As a result, as compared with the arrangements of the first to seventh embodiments previously described, the sensor 1 is much less susceptible to the influence of radio interference from the outside, in addition to the effects of the first to seventh embodiments described hereinbefore.

Although in the eighth embodiment both the shielding member and the insulating member formed of ceramics are additionally provided, only the shielding member may be provided. Alternatively, the shielding member and/or the ceramic insulating member may be also additionally provided in the first embodiment and the third to seventh embodiments.

Although in the above described embodiments four through holes 3 are provided in the main body 2, this is not limitative, but the number of the through holes may be set to any other number corresponding to the number of the cylinders of the engine.

What is claimed is:

1. A sparking voltage detecting device for an internal combustion engine having an ignition system having at least one secondary side high-tension cord, said sparking voltage detecting device being mounted on said secondary side high-tension cord, for detecting sparking voltage generated in said engine, comprising:
    a main body formed of an insulating material and having at least one through hole formed therein, said high-tension cord being fitted through said through hole in a liquidtight manner; and
    at least one conductive member embedded in said main body at a location radially outward of said through hole and spaced from said high-tension cord by a predetermined distance;
    said main body having an outer surface, and at least one incision formed therein, said incision extending from said outer surface of said main body to said through hole, said incision being forcibly expansible to an extent enough to allow said high-tension cord to be fitted into said through hole through said incision, said conductive member being arranged at a side of said main body remote from said incision with respect to said through hole.

2. A sparking voltage detecting device for an internal combustion engine having a plurality of cylinders, and an ignition system having a plurality of secondary side high-tension cords corresponding in number to the number of said cylinders, said sparking voltage detecting device being mounted on said secondary side high-tension cords, for detecting sparking voltage generated in said engine, comprising:
    a main body formed of an insulating material and having a plurality of through holes formed therein, said through holes corresponding in number to the number of said cylinders, said high-tension cords being fitted, respectively, through said through holes in a liquidtight manner; and at least one conductive member embedded in said main body at a location radially outward of said through holes and spaced from said high-tension cords by a predetermined distance;

said main body having an outer surface, and a plurality of incisions formed therein, said incisions corresponding in number to the number of said cylinders, said incisions extending from said outer surface of said main body to said through holes, respectively, said incisions being forcibly expansible to an extent enough to allow said high-tension cords to be fitted into said through holes through said incisions, respectively, said conductive member being arranged at a side of said main body remote from said incisions with respect to said through holes.

3. A sparking voltage detecting device for an internal combustion engine having an ignition system having at least one secondary side high-tension cord, said sparking voltage detecting device including a sensor mounted on said secondary side high-tension cord, for detecting sparking voltage generated in said engine, said sensor comprising:

a main body formed of an insulating material and having at least one through hole formed therein, said high-tension cord being fitted through said through hole in a liquidtight manner; and at least one conductive member embedded in said main body at a location radially outward of said through hole and spaced from said high-tension cord by a predetermined distance;

said main body having an outer surface, and at least one incision formed therein, said incision extending from said outer surface of said main body to said through hole, said incision being forcibly expansible to an extent enough to allow said high-tension cord to be fitted into said through hole through said incision, said conductive member being arranged at a side of said main body remote from said incision with respect to said through hole.

4. A sparking voltage detecting device for an internal combustion engine having a plurality of cylinders, and an ignition system having a plurality of secondary side high-tension cords corresponding in number to the number of said cylinders, said sparking voltage detecting device including a sensor mounted on said secondary side high-tension cords, for detecting sparking voltage generated in said engine, said sensor comprising:

a main body formed of an insulating material and having a plurality of through holes formed therein, said through holes corresponding in number to the number of said cylinders, said high-tension cords being fitted, respectively, through said through holes in a liquidtight manner; and at least one conductive member embedded in said main body at a location radially outward of said through holes and spaced from said high-tension cords by a predetermined distance;

said main body having an outer surface, and a plurality of incisions formed therein, said incisions corresponding in number to the number of said cylinders, said incisions extending from said outer surface of said main body to said through holes, respectively, said incisions being forcibly expansible to an extent enough to allow said high-tension cords to be fitted into said through holes through said incisions, respectively, said conductive member being arranged at a side of said main body remote from said incisions with respect to said through holes.

5. A sparking voltage detecting device for an internal combustion engine having an ignition system having at least one secondary side high-tension cord, said sparking voltage detecting device including a sensor mounted on said secondary side high-tension cord, for detecting sparking voltage generated in said engine, said sensor comprising:

a main body formed of an insulating material and having at least one through hole formed therein, said high-tension cord being fitted through said through hole in a liquidtight manner;

at least one conductive member embedded in said main body at a location radially outward of said through hole and spaced from said high-tension cord by a predetermined distance; and at least one shielding member embedded in said main body at a location outward of said conductive member radially of said through hole;

said main body having an outer surface, and at least one incision formed therein, said incision extending from said outer surface of said main body to said through hole, said incision being forcibly expansible to an extent enough to allow said high-tension cord to be fitted into said through hole through said incision, said conductive member being arranged at a side of said main body remote from said incision with respect to said through hole.

6. A sparking voltage detecting device for an internal combustion engine having a plurality of cylinders, and an ignition system having a plurality of secondary side high-tension cords corresponding in number to the number of said cylinders, said sparking voltage detecting device including a sensor mounted on said secondary side high-tension cords, for detecting sparking voltage generated in said engine, said sensor comprising:

a main body formed of an insulating material and having a plurality of through holes formed therein, said through holes corresponding in number to the number of said cylinders, said high-tension cords being fitted, respectively, through said through holes in a liquidtight manner;

at least one conductive member embedded in said main body at a location radially outward of said through holes and spaced from said high-tension cords by a predetermined distance; and at least one shielding member embedded in said main body at a location outward of said conductive member radially of said through holes said main body having an outer surface, and a plurality of incisions formed therein, said incisions corresponding in number to the number of said cylinders, said incisions extending from said outer surface of said main body to said through holes, respectively, said incisions being forcibly expansible to an extent enough to allow said high-tension cords to be fitted into said through holes through said incisions, respectively, said conductive member being arranged at a side of said main body remote from said incisions with respect to said through holes.

7. A sparking voltage detecting device as claimed in claim 5 or 6, including a lead wire formed of a shielding wire, said lead wire being connected to said conductive member and said shielding member for transmitting a voltage signal generated in said conductive member.

8. A sparking voltage detecting device for an internal combustion engine having an ignition system having at least one secondary side high-tension cord, said sparking voltage detecting device including a sensor mounted on said secondary side high-tension cord, for detecting sparking voltage generated in said engine, said sensor comprising:
   a main body formed of an insulating material and having at least one through hole formed therein, said high-tension cord being fitted through said through hole in a liquidtight manner;
   at least one conductive member embedded in said main body at a location radially outward of said through hole and spaced from said high-tension cord by a predetermined distance; and
   at least one insulating member formed of ceramics, said insulating member being embedded in said main body at a location between said through hole and said conductive member
   said main body having an outer surface, and at least one incision formed therein, said incision extending from said outer surface of said main body to said through hole, said incision being forcibly expansible to an extent enough to allow said high-tension cord to be fitted into said through hole through said incision, said conductive member being arranged at a side of said main body remote from said incision with respect to said through hole.

9. A sparking voltage detecting device as claimed in any of claims 1, 3, 5 or 8, wherein said conductive member comprises a conductive member arranged at one lateral side of said main body with respect to said through hole.

10. A sparking voltage detecting device as claimed in any of claims 1, 3, 5 or 8, wherein said through hole has a diameter larger than an outer diameter of said high-tension cord, said through hole having opposite ends thereof formed with annular lips disposed in liquidtight contact with an outer peripheral surface of said high-tension cord for preventing infiltration of water into a clearance between said through hole and said high-tension cord.

11. A sparking voltage detecting device for an internal combustion engine having a plurality of cylinders, and an ignition system having a plurality of secondary side high-tension cords corresponding to number to the number of said cylinders, said sparking voltage detecting device including a sensor mounted on said secondary side high-tension cord, for detecting sparking voltage generated in said engine, said sensor comprising:
   a main body formed of an insulating material and having a plurality of through holes formed therein, said through holes corresponding in number to the number of said cylinders, said high-tension cords being fitted, respectively, through said through holes in a liquidtight manner;
   at least one conductive member embedded in said main body at a location radially outward of said through holes and spaced from said high-tension cords by a predetermined distance; and
   at least one insulating member formed of ceramics, said insulating member being embedded in said main body at a location between said through holes and said conductive member;
   said main body having an outer surface, and a plurality of incisions formed therein, said incisions corresponding in number to the number of said cylinders, said incisions extending from said outer surface of said main body to said through holes, respectively, said incisions being forcibly expansible to an extent enough to allow said high-tension cords to be fitted into said through holes through said incisions, respectively, said conductive member being arranged at a side of said main body remote from said incisions with respect to said through holes.

12. A sparking voltage detecting device as claimed in any of claims 2, 4, 6, or 11, wherein said through holes are disposed in a manner such that centers thereof are located along a line intersecting with axes thereof at right angles, said through holes being arranged at equal intervals in a direction perpendicular to said axes.

13. A sparking voltage detecting device as claimed inn claim 12, wherein said conductive member comprises a conductive member arranged at one lateral side of said main body with respect to said through holes.

14. A sparking voltage detecting device as claimed in claim 12, wherein said conductive member has a plurality of portions facing respective ones of said through holes, said portions being combined with each other.

15. A sparking voltage detecting device as claimed in any of claims 2, 4, 6 or 11, wherein said through holes are disposed in a manner such that centers thereof are located along a circle formed about a central portion of said main body, said through holes being circumferentially arranged at equal intervals.

16. A sparking voltage detecting device as claimed in any of claims 2, 4, 6, or 11, wherein said conductive member comprises a conductive member arranged at one lateral side of said main body with respect to said through holes.

17. A sparking voltage detecting device as claimed in any of claims 2, 4, 6 or 11, wherein said through holes each have a diameter larger than an outer diameter of said high-tension cord, said through holes each having opposite ends thereof formed with annular lips disposed in liquidtight contact with an outer peripheral surface of a corresponding one of said high-tension cords for preventing infiltration of water into a clearance between said each through hole and said corresponding high-tension cord.

18. A sparking voltage detecting device as claimed in any one of claims 1 to 6, 8 and 11 including a lead wire formed of a shielding wire, said lead a wire being connected to said conductive member for transmitting a voltage signal generated in said conductive member.

* * * * *